United States Patent
Zimnicki et al.

(12) 
(10) Patent No.: US 6,249,074 B1
(45) Date of Patent: Jun. 19, 2001

(54) PIEZOELECTRIC RESONATOR USING SACRIFICIAL LAYER AND METHOD OF TUNING SAME

(75) Inventors: Charles Zimnicki; James F. Caruba, both of Bartlett; Piyush Chaudhari, Carpentersville; Theodore Lind, Lombard, all of IL (US)

(73) Assignee: CTs Corporation, Elkhart, IN (US)

( * ) Notice: Subject to any disclaimer, the term of this patent is extended or adjusted under 35 U.S.C. 154(b) by 0 days.

(21) Appl. No.: 08/918,616

(22) Filed: Aug. 22, 1997

(51) Int. Cl.$^7$ ................................................. H01L 41/08
(52) U.S. Cl. ................................................. 310/312
(58) Field of Search ............................................ 310/312

(56) References Cited

U.S. PATENT DOCUMENTS

| | | | |
|---|---|---|---|
| 4,326,142 | * | 4/1982 | Mattuschka ........................ 310/320 |
| 4,638,536 | * | 1/1987 | Vig ....................................... 310/312 |
| 4,837,475 | * | 6/1989 | EerNisse et al. ..................... 310/312 |
| 5,022,130 | * | 6/1991 | EerNisse et al. ..................... 310/312 |

FOREIGN PATENT DOCUMENTS

| | | | | |
|---|---|---|---|---|
| 2262784 | * | 7/1973 | (DE) | .................................. 310/312 |
| 57-104313 | * | 6/1982 | (JP) | .................................. 310/312 |
| 58-170108 | * | 10/1983 | (JP) | .................................. 310/312 |
| 2-192210 | * | 7/1990 | (JP) | .................................. 310/312 |

* cited by examiner

Primary Examiner—Thomas M. Dougherty

(57) ABSTRACT

A piezoelectric resonator (10) having a sacrificial mass-loading layer (16). Material is removed from the mass-loading layer (16) to raise a resonator frequency to a desired target. The sacrificial layer (16) is of a dense material, such as silver or gold, but is of such a relative thin layer that it can be used on high frequency aluminum electrodes (14) of a resonator (10) without increasing adverse spurious frequency problems. It is not necessary that the mass-loading layer (16) be conductive. In addition, the silver or gold sacrificial layer (16) can be removed by ion milling at practical and economical rates, unlike aluminum or aluminum oxide. Preferably, a diffusion barrier (18) is interposed between the electrodes (14) and the mass-loading layer (16).

16 Claims, 2 Drawing Sheets

PIEZOELECTRIC RESONATOR USING SACRIFICIAL LAYER AND METHOD OF TUNING SAME

FIELD OF THE INVENTION

The present invention relates generally to piezoelectric devices and, in particular, to electrode devices for piezoelectric resonators.

BACKGROUND OF THE INVENTION

Piezoelectric crystals have been used for many decades as frequency control elements in radio communication devices because of their stable resonant frequency signal generation during operation. Generally, the resonant frequency of a particular piezoelectric crystal is tuned to a desired frequency by changing the mass loading of the crystal. Typically, this has been accomplished by adding or removing mass from the electrode portion of the crystal. As the resonant frequency is very sensitive to changes in mass loading, small changes in mass can change frequency dramatically. Mass can also be added or removed from the piezoelectric material directly. However, it is much more difficult to add or remove the piezoelectric material, typically a dielectric, than it is to add or remove electrode material, typically a metal.

Prior art methods of adding mass to a crystal have included vacuum evaporative deposition of a metal to the electrode of the crystal. Typically, this can be done at a very high rate of speed. In addition, adding material to an electrode of a crystal does not alter, change or damage the electrode to any significant degree. As a result, there is very little detriment to the performance of the crystal. However, electrical shorting is possible between multiple resonators.

Prior art methods of removing mass from a crystal, such as laser or ion milling for example, have proven more difficult to do successfully, in particular where high throughput is desired. Removing material from the electrode or the piezoelectric material causes damage, which detrimentally affects the performance of the crystal. This gives rise to higher resistance devices, intermodulation distortion, and poor aging characteristics. In addition, some metals such as aluminum form an oxide layer, even under typical production vacuum levels. Oxide layers are much harder to remove at an adequate rate unless high power is used. However, high power accelerates any damage being done to the crystal and heats the crystal making it difficult to accurately measure frequency while processing the crystal. Moreover, mass removal is non-linear, in that, once the oxide layer is penetrated, mass removal rates changes significantly. Therefore, mass removal techniques have proven hard to control.

To be sure, there are metals that do not oxide significantly, such as the noble metals of gold and silver. However, these metals are typically very heavy and can not be used for higher frequency resonators due to extreme mass loading problems. In addition, metals such as gold and silver require more metal thickness to become usefully conductive than do lighter weight metals such as aluminum. As is recognized in the art, high frequency devices, in particular fundament devices, require the use of lightweight electrodes to prevent adverse spurious frequency modes from occurring.

There is a need for a piezoelectric resonator that can be tuned by mass removal at a relatively high rate, with little degradation of device performance. There is also a need for a piezoelectric resonator that can be tuned by mass removal at a substantially linear rate, and that can be realized in a simple, readily manufacturable form, at a low cost and high yield.

DETAILED DESCRIPTION OF THE PREFERRED EMBODIMENT

The present invention utilizes a sacrificial mass-loading layer disposed on an electroded piezoelectric resonator. This layer is then removed to tune the resonator to a desired frequency. Preferably, the sacrificial mass-loading layer is of a thinner layer but higher density than the electrodes but may be of a lower density if dielectric materials are used. Removing the sacrificial layer reduces mass-loading in the electrode region which improves the spurious response of the resonator.

Figure 1:
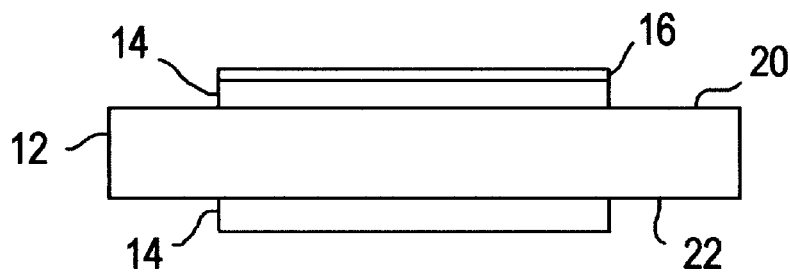
FIG. 1 shows a side view of a first embodiment of a piezoelectric resonator, in accordance with the present invention.

FIG. 1 shows a top view of a first embodiment of the present invention. A piezoelectric resonator 10 is shown which includes a piezoelectric plate 12 having an upper surface 20 and a lower surface 22. Electrodes 14 are disposed on the upper and lower surfaces 20, 22 of the plate 12. The electrodes 14 are substantially opposing forming a trapped-energy resonator as is known in the art. A sacrificial mass-loading layer 16 is disposed on a portion of the electrodes 14. The layer 16 can be disposed on one or both of the electrodes 14 and on any portion thereof. In addition, the layer 16 can be disposed on a portion of a non-electroded region of the plate 12. Initially, the sacrificial mass-loading layer 16 causes the piezoelectric resonator 10 to resonate at a preliminary frequency that is lower than a final desired frequency. Removing material from the sacrificial mass-loading layer 16 tunes the piezoelectric resonator 10 to a final desired frequency.

Although useful for all types of piezoelectric resonators, the present invention is particularly useful in those applications having a high frequency mode of operation. In these cases, any significant mass-loading of the resonator causes spurious frequency modes to arise. Typical noble metals, such as silver and gold, used in low frequency piezoelectric resonator applications have a high density and require relatively thick layer before they become sufficiently conductive to be useful. Such a high density, thick layer provides significant mass-loading of the resonator which causes spurious frequency modes to arise. This is not acceptable. Therefore, a light weight metal such as aluminum is the desired metal of choice in these applications. Aluminum, is of a relatively low density and becomes conductive at very thin thicknesses.

Preferably, ion milling desputtering is used to remove the portions of the sacrificial mass-loading layer. Ion milling leaves an atomically clean surface which enhances crystal aging due to surface contamination. Directly ion milling an aluminum film on a crystal is not practical since aluminum cannot be removed at economical rates. This is because an aluminum oxide layer forms at the surface, and this oxide desputters at very low rates. In addition, the oxide continuously forms at the surface, even under practical vacuum levels, because of residual oxygen present in all but the best vacuum systems. In contrast, the noble metals such as gold and silver readily desputter under ion milling.

A novel aspect of the present invention is that it provides a light weight electrode base layer, such as aluminum, and a readily desputtered mass-loading layer, such as silver or gold. The silver or gold used is of such a thin layer that mass loading is minimal. The layer is not required to be conductive since it is only present to provide mass loading. In addition, desputtering the layer further reduces the mass-loading of the electrode while leaving an atomically clean surface. The present invention provides that most of the mass-loading layer is removed such that the resonator behaves nearly the same as if having a single layer aluminum electrode.

Figure 2:
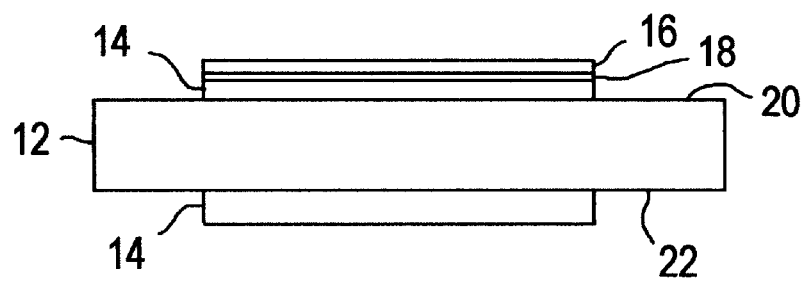
FIG. 2 shows a side view of a preferred embodiment of a piezoelectric resonator, in accordance with the present invention.
Figure 5:
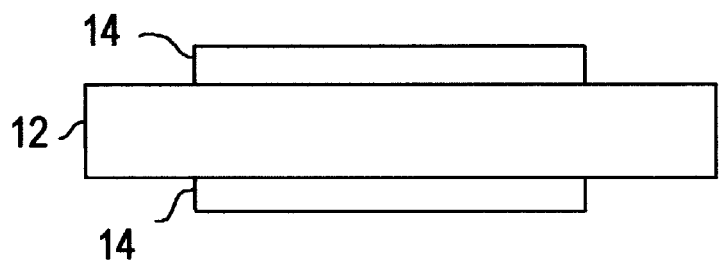
FIG. 5 shows a side view of a first step in a method of providing a tuned piezoelectric resonator, in accordance with the present invention.
Figure 6:
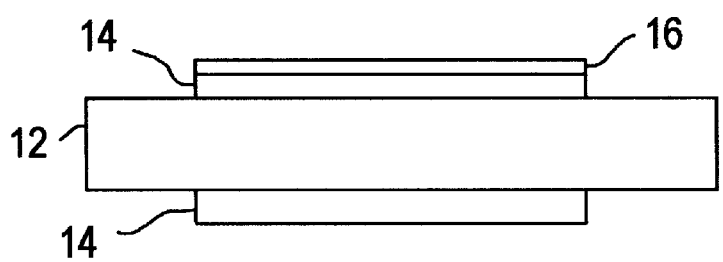
FIG. 6 shows a side view of a second step in a method of providing a tuned piezoelectric resonator, in accordance with the present invention.
Figure 7:
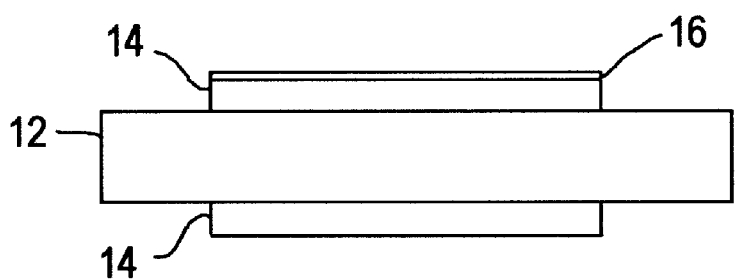
FIG. 7 shows a side view of a third step in a method of providing a tuned piezoelectric resonator, in accordance with the present invention.

It is known in the art that coupling gold with aluminum causes the two materials to diffuse causing a degradation of the materials at their junction. Therefore, in a preferred embodiment, as shown in FIG. 2, the piezoelectric resonator 10 of FIG. 1 further comprises a diffusion barrier 18 interposed between the electrodes 14 and the sacrificial mass-loading layer 16. More preferably, the diffusion barrier 18 is an oxide layer which improves adhesion of the sacrificial layer 16 to the electrodes 14. Fortunately, a natural aluminum oxide layer easily forms on the aluminum as discussed earlier. This oxide is now a desired feature where before it was not desired. It is also known in the art that there exists other diffusion barriers which also can be effectively used to reduce the amount of inter-diffusion between the sacrificial mass-loading layer and the electrodes.

The operable features of the present invention can be described as having the electrodes of a metal having a lower density than the material of the sacrificial mass-loading layer. In particular, the sacrificial mass-loading layer has a total mass less than that of the electrodes. In addition, the sacrificial mass-loading layer comprises a material which, when exposed to an ion beam, is removed more rapidly than aluminum oxide. Preferably, the material of the sacrificial mass-loading layer is selected from at least one of the noble metals including silver and gold. Noble metals such as gold or silver are desired as these materials do not readily oxidize causing aging problems that shift resonator frequency. In addition, the sacrificial mass-loading layer is of such a thin layer as to minimize spurious frequency problems of the resonator. In particular, the sacrificial mass-loading layer has a thickness of less than 300 Angstroms.

For example, 70 MHz filter crystals were built, in accordance with the present invention, using the following metalization scheme, by evaporating each layer as presented onto a quartz plate:

Side 1
   Aluminum electrode; 1500 angstroms

Side 1
   Aluminum electrode; 1500 angstroms
   Chrome diffusion barrier; 40 angstroms Side 2
   Aluminum electrode; 1000 angstroms
   Chrome diffusion barrier; 40 angstroms
   Silver sacrificial layer; 150 angstroms An ion desputtering process was then used to thin the silver layer by up to 120 angstroms to achieve the desired final frequency. The total amount of thickness desputtered depends upon the amount of tuning required to put the unit onto the desired frequency as well as the amount of inter-diffusion between the sacrificial layer and the electrode.

The silver (or gold) layer is necessary because the sputter rates are higher than for aluminum or aluminum oxide. For example, the sputter rates (relative to silver) for a 500 eV ion beam at 1 mA/sq. cm. are as follows:

| Material | Sputter rate | Ratio |
|---|---|---|
| silver (Ag) | 1800 angstroms/min. | 100% |
| gold (Au) | 1000 angstroms/min. | 55.6% |
| aluminum (Al) | 600 angstroms/min. | 33.3% |
| aluminum oxide | 80 angstroms/min. | 4.4% |

It can be seen that the desputter rate for aluminum oxide is only 4.4% the rate for silver. This rate is much too slow for economic and practical production requirements. By using either a gold or silver sacrificial layer tuning can proceed at more than ten times the rate possible with aluminum oxide or two times the rate of aluminum.

After tuning, the sacrificial layer has been greatly thinned. If for example 60 angstroms of the layer remains on the top side of Side 2, the mass loading of that electrode is only 8.4% greater than a pure aluminum electrode. This means that by using the sacrificial layer and removing a substantial portion of the mass of this layer in tuning, performance approaching that of a pure aluminum electrode is achieved resulting in significantly improved spurious frequency performance over a unit made with conventional evaporative tuning.

Figure 3:
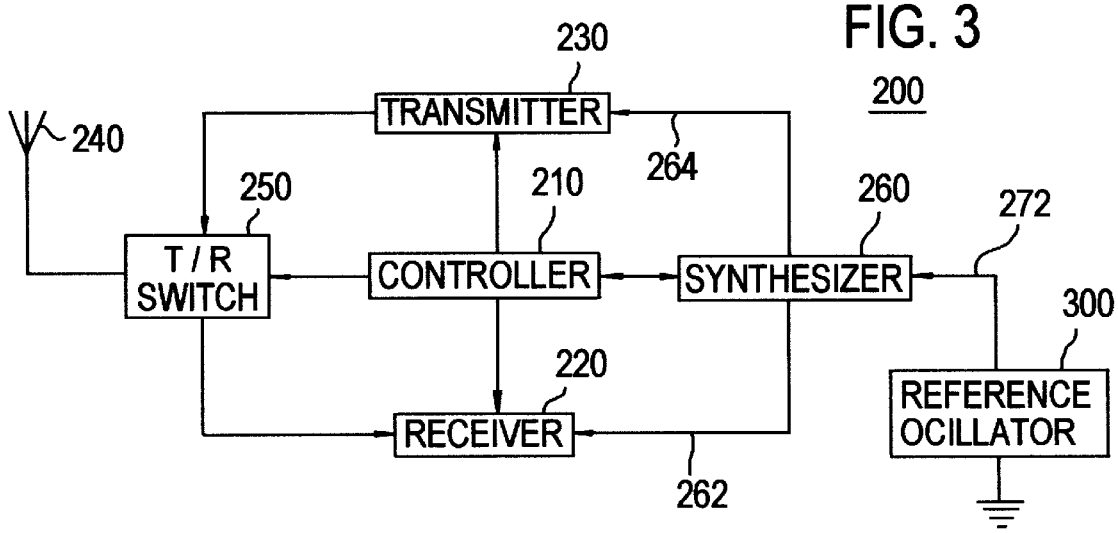
FIG. 3 is a block diagram of a communication device which uses the piezoelectric resonator of the present invention.
Figure 4:
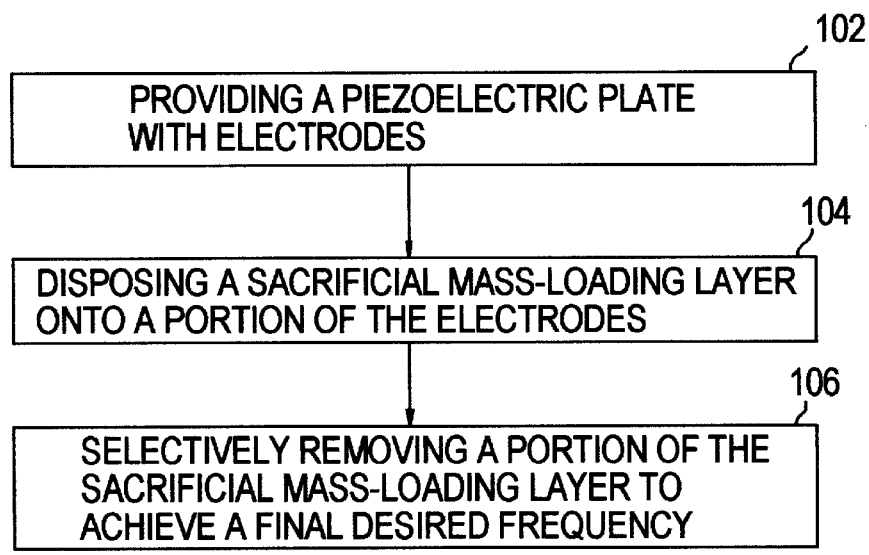
FIG. 4 is a flow diagram of a method to provide a piezoelectric resonator, in accordance with the present invention.

FIG. 3 shows a block diagram of a communication device 200 which includes a reference oscillator 300. The reference oscillator 300 utilizes a piezoelectric resonator, in accordance with the present invention. In one embodiment, the communication device 200 is a well known frequency synthesized two-way transceiver which operates under the control of a controller 210. The communication device 200 includes a receiver 220 and a transmitter 230 which receive and transmit RF via an antenna 240. The antenna 240 is appropriately coupled between the receiver 220 and the transmitter 230 by a duplexer or a switch 250. The communication device 200 also includes a well known phase locked loop synthesizer 260 which, under the control of the controller 210, provides a receiver local oscillator signal 262 and a transmitter local oscillator signal 264. The reference oscillator 300 includes the piezoelectric resonator of the present invention and provides a reference signal 272 for the synthesizer 260 utilizing the principles of the present invention.

The present invention also provides a method 100 of providing a tuned piezoelectric resonator. A first step 102 of the method 100 includes providing a piezoelectric plate with substantially opposing electrodes. In high frequency applications, it is preferred that the electrodes are of a lightweight material such as aluminum to prevent spurious frequency responses.

In a preferred embodiment, a diffusion barrier is disposed on a portion of the electrodes to separate the electrodes from the subsequently applied mass loading layer, and to improve adhesion of the mass-loading layer to the resonator. The diffusion barrier is as thin as is necessary to prevent diffusion. Any additional material in the diffusion barrier is not necessary and adds mass which degrade the frequency response of the resonator. In particular, the diffusion barrier is a thin oxide layer, such as aluminum oxide. The diffusion barrier can be formed naturally, such as aluminum oxide formation on aluminum, or by other processes known in the art such as evaporative deposition, sputtering, or anodic oxidation. Other diffusion barriers, such as aluminum nitride for example, can also be used.

A second step 104 includes disposing a sacrificial mass-loading layer onto a portion of the electrodes. Preferably, the sacrificial mass-loading layer has a higher density than the electrodes of the providing step. In particular, the sacrificial mass-loading layer is of less total mass than that of the electrodes of the providing step. In addition, it is preferred that the sacrificial mass-loading layer is of a material which, when exposed to an ion beam, is removed more rapidly than aluminum oxide. Noble metals are particularly suited for this application as these materials meet both of the above criteria. In particular, the sacrificial mass-loading layer is selected from at least one of the group consisting of silver and gold as these metals provide good aging characteristics for the resonator.

It is desired to provide a preliminary frequency for the piezoelectric resonator which is less than a final desired frequency. In this way, the mass-loading layer can be subsequently desputtered, through an ion milling process for example, removing a portion of the mass-loading layer to tune the resonator to a desired final frequency. Ion milling also provides for a atomically clean surface which provides good aging characteristics for the resonator.

It is preferred that the mass-loading layer is of high quality gold or silver plated under optimum vacuum conditions at high energy levels. In particular, the sacrificial mass-loading layer has a thickness of less than 300 Angstroms in order to prevent spurious frequency responses in high frequency resonators.

A third step 106 includes selectively removing a portion of the sacrificial mass-loading layer such that a final desired frequency is achieved. This may be achieved by reactive ion etching or desputtering portions of the mass-loading layer. Preferably, this is accomplished by ion milling as high rates of removal can be achieved. It is desired that very little of the mass-loading layer remains after final tuning such that the resonator behaves as if only the electrodes are present.

The present invention provides several advantages. A resonator with high quality and minimally mass-loaded electrodes is provided which reduces spurious frequency modes, resistance, aging, and intermodulation distortion. A resonator is provided which can be ion-milled to a desired frequency at a high rate. A tuned resonator is provided with an atomically clean surface to reduce aging effects, crystal drive level dependency, and poor starting resistance; crystal problems known in the art.

In addition, a method of tuning is provided which eliminates shorting between electrodes of resonators, as occurs in evaporative deposition on piezoelectric filters. A method of tuning is provided which uses less gold than evaporative plating tuning systems. A method of tuning is provided which requires less maintenance than evaporative plating tuning systems that require constant addition of gold to operate. A method of tuning is provided which is faster than evaporative plating tuning systems. A method of tuning is provided which does not require the complicated masking of evaporative plating tuning systems as the ion beam can be shaped and directed. In addition, ion milling selectively removes material much faster from the mass-loading layer than from the piezoelectric plate. Therefore, if the ion beam is misaligned, no harm results. This is not true in evaporative plating tuning systems.

The long term trend in resonator design is for the reduction in size of the resonators and their electrodes to meet the requirements of ever smaller communication devices. This reduction in size increase the degree of tolerance and associated costs required for accurate masking fixtures and resonator positioning in evaporative plating tuning systems. The present invention provides ion milling tuning which does not damage unplated portions of resonator plates, and since it does not add metal it cannot mass-load areas outside of the electrodes, nor can it cause electrical short by depositing material in the wrong areas. These features make ion tuning much easier to implement and more robust as resonator sizes continue to decrease. This is particularly true as the number of poles (electrodes) increase in multi-pole monolithic filters. Evaporative plating tuning systems become many times more complex as electrodes are added. An ion milling tuning system essentially remains unchanged except for programming.

Although various embodiments of this invention have been shown and described, it should be understood that various modifications and substitutions, as well as rearrangements and combinations of the preceding embodiments, can be made by those skilled in the art, without departing from novel spirit and scope of this invention.

What is claimed is:

1. A piezoelectric resonator, comprising:
a piezoelectric plate having an upper and a lower opposing surfaces;
electrodes disposed on the upper and lower surfaces of the plate, the electrodes being substantially opposing;
a sacrificial mass-loading layer disposed on a portion of the electrodes wherein the sacrificial mass-loading layer causes the piezoelectric resonator to resonate at a preliminary frequency that is lower than a final desired frequency, and wherein material removed from the sacrificial mass-loading layer tunes the piezoelectric resonator to the final desired frequency such that the resonator behaves nearly the same as if having the substantially opposing electrodes without the sacrificial mass-loading layer; and
a diffusion barrier interposed between the electrodes and the sacrificial mass-loading layer, the diffusion barrier being selected from one of the group of chrome, an oxide of chrome, and an oxide of aluminum.

2. The piezoelectric resonator of claim 1, wherein the mass-loading layer is a dielectric and of a lower density than the electrodes.

3. The piezoelectric resonator of claim 1, wherein the electrodes are of a metal having a lower density than the material of the sacrificial mass-loading layer.

4. The piezoelectric resonator of claim 1, wherein the mass-loading layer is a substantially non-conductive layer of a noble metal.

5. The piezoelectric resonator of claim 3, wherein the sacrificial mass-loading layer comprises a material which, when exposed to an ion beam, is removed more rapidly than aluminum oxide.

6. The piezoelectric resonator of claim 1, wherein the material of the sacrificial mass-loading layer is selected from at least one of the group consisting of a dielectric, silver, and gold.

7. The piezoelectric resonator of claim 1, wherein the sacrificial mass-loading layer has a thickness of less than 300 Angstroms.

8. The piezoelectric resonator of claim 1, wherein the sacrificial mass-loading layer has a total mass less than that of the electrodes.

9. A method of providing a tuned piezoelectric resonator, comprising the steps of:

providing a piezoelectric plate with substantially opposing electrodes;

disposing a diffusion barrier on said electrodes, said diffusion barrier being selected from one of the group of chrome, an oxide of chrome, and an oxide of aluminum;

disposing a sacrificial mass-loading layer onto a portion of the electrodes wherein a frequency of the piezoelectric resonator is less than a final desired frequency; and selectively removing most of the sacrificial mass-loading layer such that the final desired frequency is achieved, and the resonator behaves nearly the same as if having the substantially opposing electrodes without the sacrificial mass-loading layer.

10. The method of claim 9, wherein the disposing step includes the sacrificial mass-loading layer having a higher density than the electrodes of the providing step.

11. The method of claim 9, wherein the disposing step includes the mass-loading layer being a dielectric of a lower density than the electrodes of the providing step.

12. The method of claim 9, wherein the disposing step includes the mass-loading layer being a substantially non-conductive layer of a noble metal.

13. The method of claim 9, wherein the disposing step includes the sacrificial mass-loading layer being a material which, when exposed to an ion beam, is removed more rapidly than aluminum oxide.

14. The method of claim 9, wherein the disposing step includes the sacrificial mass-loading layer being selected from at least one of the group consisting of a dielectric, silver, and gold.

15. The method of claim 9, wherein the disposing step includes the sacrificial mass-loading layer having a thickness of less than 300 Angstroms.

16. The method of claim 9, wherein the disposing step includes the sacrificial mass-loading layer being of less total mass than that of the electrodes of the providing step.

* * * * *